United States Patent [19]

Boeckmann

[11] Patent Number: 4,625,128
[45] Date of Patent: Nov. 25, 1986

[54] INTEGRATED CIRCUIT TEMPERATURE SENSOR

[75] Inventor: Eduard F. B. Boeckmann, Huntsville, Ala.

[73] Assignee: GTE Communication Systems Corp., Northlake, Ill.

[21] Appl. No.: 779,004

[22] Filed: Sep. 23, 1985

[51] Int. Cl.$^4$ .......................... H03K 3/26; G01K 7/00
[52] U.S. Cl. ...................................... 307/310; 307/254; 307/296 R; 307/303; 374/178
[58] Field of Search ................... 307/296 R, 310, 254, 307/308, 303; 374/178; 357/28

[56] References Cited

U.S. PATENT DOCUMENTS 3,641,372 2/1972 Green et al. ...................... 307/310
3,899,695 8/1975 Solomon et al. ................... 307/310

Primary Examiner—Stanley D. Miller
Assistant Examiner—B. P. Davis
Attorney, Agent, or Firm—Robert J. Black

[57] ABSTRACT

An electrical circuit functioning as a temperature sensor which is fully compatible with silicon chip and similar integrated circuit technology. Four matched NPN bipolar transistors provide a circuit that detects changes in temperature by monitoring the current throughput in operation. Environmental temperatures increase current approximately one order of magnitude for each 25 degrees centigrade of changing temperature. With a current gain of 100 for each transistor employed, the current increases from 0.1 microamp at 0 degrees centigrade to 11 microamps at 50 degrees centigrade.

7 Claims, 2 Drawing Figures

INTEGRATED CIRCUIT TEMPERATURE SENSOR

BACKGROUND OF THE INVENTION

1. Technical Field

The present invention relates to temperature sensor devices and more particularly to a circuit device that is compatible with integrated circuit technology and converts a change in temperature in its immediate environment to a proportional electrical current.

2. Background Art

Many devices are available for sensing temperature. Examples of such devices includes thermocouples, thermistors, silicon resistors, special wire wound resistors, bi-metallic devices, thermometers, etc. Especially desired are devices that depend on basic physical constants as opposed to devices that are subject to variation of properties due to process variations. Most available discrete devices for temperature sensing are not compatible with integrated circuit technology. That is they cannot be placed on a silicon chip with other circuitry utilizing a standard process. Some techniques have been developed which utilize an integrated resistor or diode for sensing. This technique results only in approximately a linear variation in the device parameter with temperature. In some cases it may be desirable to have a nonlinear or rapidly changing response to temperature so that a switching action may be directly obtained. A switching type device will change several orders of magnitude at the switching temperature and therefore is of a nonlinear nature.

SUMMARY OF THE INVENTION

The present invention consists of four matched NPN bi-polar transistors. To obtain the close matching characteristics the most desirable technique is to use integrated circuit technology with all the transistors being located on the same die. With the matched transistor characteristics, the temperature effects being independent of the transistor DC current gain (HFE or Beta).

The present invention utilizes a reverse transistor with its emitter connected to a positive constant source of voltage of approximately 1 volt. The collector of this transistor then feeds the collector of a second transistor with the emitter of the second transistor being connected to the base of the first transistor and its base being connected to the positive supply. It should be noted however that the first transistor could also be connected in the forward direction as well as the reverse direction. However current will be of a much larger magnitude than may be required depending on the application. A third transistor is then connected with its collector tied to the emitter of the second transistor and its emitter connected to a common or return. Bias current for the third transistor is provided by a fourth transistor. This fourth transistor is connected with its base connected to the positive supply, its collector is tied to the collectors of the first two transistors and its emitter feeds bias current to the third transistor.

In operation the current flowing through the third transistor to common is dependant on the environmental or die temperature increasing approximately one order of magnitude for each 25 degrees centigrade in change in temperature. With a current gain of 100 for each transistor the current increase from 0.1 microamp at 0 degrees Centigrade to 11 microamps at 50 degrees Centigrade.

DESCRIPTION OF THE PREFERRED EMBODIMENT

Figure 1:
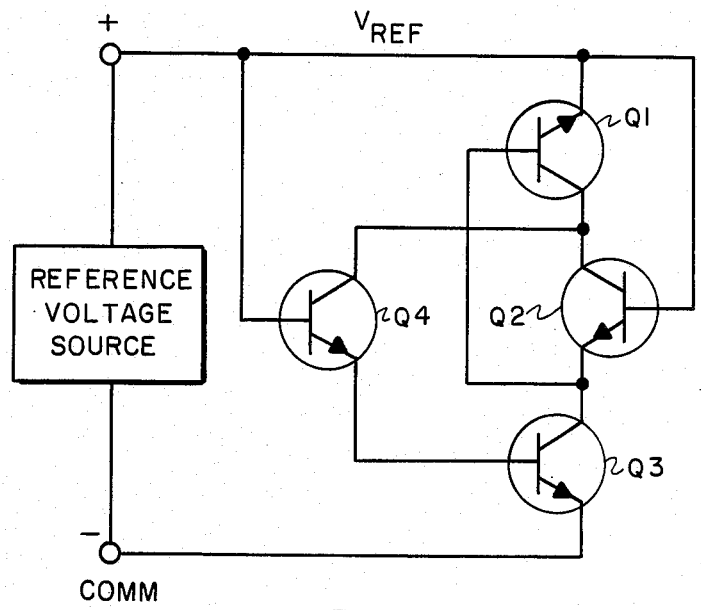
FIG. 1 is a schematic circuit diagram of a temperature sensor referred to hereinafter as a temperature variable current source (TVCS) in accordance with the present invention.

Referring first to FIG. 1, the basic elements of the temperature variable current source in accordance with the present invention are shown. Transistor Q1 is a reversed transistor providing the basic temperature control leakage current. Transistors Q2 and Q3 gate the leakage current through to the power supply common bus. Transistor Q4 in turn provides bias for transistor Q3 and contributes base current to the sum. The reference voltage is usually held just under 1 volt to keep transistor Q3 and Q4 just into the active region. It is important in the circuit arrangement of the present invention that the reference voltage $V_{ref}$ must not be allowed to saturate the emitter base diodes of transistors Q3 and Q4.

The circuit of the present invention can be described as behaving much like a diode in the reverse leakage mode but showing the special temperature characteristics as described previously.

Figure 2:
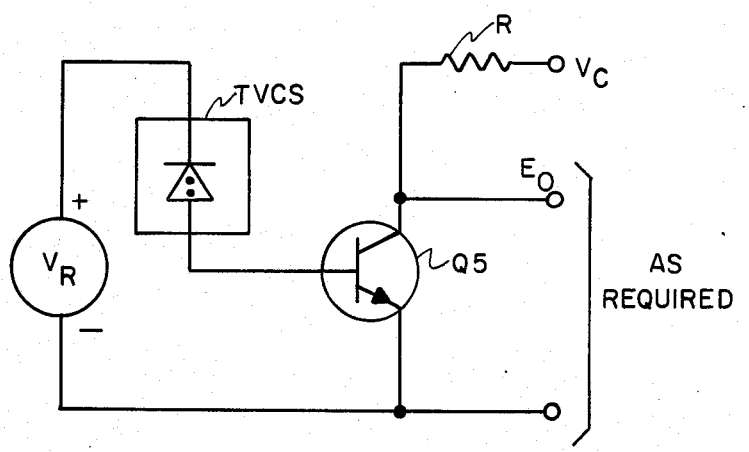
FIG. 2 is a simplified schematic diagram drawing a possible application of a temperature variable current source in accordance with the present invention.

Referring now to FIG. 2, the temperature variable current source (TVCS) is shown as a special diode symbol. The transistor Q5 in this figure is turned on by the temperature variable current source (TVCS) when the temperature becomes high enough that is the critical temperature for this particular application circuit. Thus the circuitry of FIG. 2 can be considered as a temperature sensitive or controlled transistorized switch.

It would be obvious from the above that the principle feature of the present invention is a circuit that can be used to detect changes in temperature by monitoring its current throughput.

It will be obvious to those skilled in the art that numerous modifications can be made to the present circuit without departing from the spirit of the present invention which shall be limited only be the scope of the claims appended hereto.

What is claimed is:

1. A circuit for sensing environmental temperature changes comprising:
   first, second, third and fourth transistors, each including base, emitter and collector electrodes;
   a source of reference voltage including positive and common output terminals;
   said first transistor emitter, said second transistor base and said fourth transistor base all connected to said reference voltage positive terminal;
   the collectors of said first, second and fourth transistors all connected together;
   said first transistor base and said second transistor emitter both connected to said third transistor collector;
   said fourth transistor emitter connected to said third transistor base; and
   said third transistor emitter connected to said reference voltage common terminal;
   said circuit operated in response to environmental temperature changes to vary the current flow through said third transistor proportionate to said temperature changes.

2. A circuit for sensing environmental temperature changes as claimed in claim 1, wherein: said first, second, third and fourth transistors are all of the NPN bi-polar type.

3. A circuit for sensing environmental temperature changes as claimed in claim 1, wherein: said first, second, third and fourth transistors all have matched characteristics.

4. A circuit for sensing environmental temperature changes as claimed in claim 1, wherein: all of said transistors are part of a common integrated circuit unit.

5. A circuit for sensing environmental temperature changes as claimed in claim 1, wherein: said source of reference voltage has an output voltage between 0.9 and 1.1 volts.

6. A circuit for sensing environmental temperature changes as claimed in claim 1, wherein: each of said transistors has a current gain between 90 and 110.

7. A circuit for sensing environmental temperature changes as claimed in claim 6, wherein: current flowing through said third transistor increases from 0.1 microamperes at 0 degrees Centigrade to 11 microamperes at 50 degrees centigrade.

* * * * *